US006816034B2

(12) United States Patent
Hamaguchi et al.

(10) Patent No.: US 6,816,034 B2
(45) Date of Patent: Nov. 9, 2004

(54) ELECTRONIC PART SUCH AS DIELECTRIC FILTER OR DUPLEXER AND METHOD OF FORMING AN ELECTRODE OF SUCH AN ELECTRONIC PART

(75) Inventors: Yukihiro Hamaguchi, Mie (JP); Hidefumi Suzuki, Mie (JP); Shoji Ono, Mie (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 41 days.

(21) Appl. No.: 10/396,816

(22) Filed: Mar. 26, 2003

(65) Prior Publication Data

US 2003/0184415 A1 Oct. 2, 2003

(30) Foreign Application Priority Data

Mar. 29, 2002 (JP) ....................................... 2002-097301

(51) Int. Cl.$^{7}$ .................................................. H03H 9/00

(52) U.S. Cl. ....................... 333/186; 333/193; 333/195; 333/197

(58) Field of Search ......................... 333/186, 193–195, 333/197–202, 219, 227

(56) References Cited

U.S. PATENT DOCUMENTS 5,696,472 A * 12/1997 Kaida ......................... 333/189
5,783,980 A 7/1998 Blair et al.
2001/0008388 A1 7/2001 Jun et al.

FOREIGN PATENT DOCUMENTS

| | | |
|---|---|---|
| EP | 1 087 457 | 3/2001 |
| JP | 030240302 A | 10/1991 |
| JP | 2000004105 A | 6/1998 |
| JP | 2001-160701 | 6/2001 |

* cited by examiner

*Primary Examiner*—Kenneth B. Wells
(74) *Attorney, Agent, or Firm*—Stites & Harbison PLLC; Ross F. Hunt, Jr.

(57) ABSTRACT

An electronic part such as a dielectric duplexer or filter is provided which comprises a dielectric ceramic block having a pair of opposite first and second side surfaces and an end surface meeting the first and second side surfaces nearly at right angles, an extension-electrode forming notch formed in the end surface so as to have an open end at the first side surface, a dummy electrode-forming notch formed in the end surface so as to have an open end at the second surface, the extension electrode-forming notch and the dummy electrode-forming notch corresponding in shape and position when observed in the direction in which the first and second side surfaces are opposed, an extension electrode formed in the extension electrode-forming notch, and a dummy electrode formed in the dummy electrode-forming notch. A method of forming an electrode of such an electronic part is also provided.

13 Claims, 5 Drawing Sheets

ELECTRONIC PART SUCH AS DIELECTRIC FILTER OR DUPLEXER AND METHOD OF FORMING AN ELECTRODE OF SUCH AN ELECTRONIC PART

BACKGROUND OF THE INVENTION

The present invention relates to an electronic part such as a dielectric filter or duplexer, having a plurality of resonators arranged parallely in a row for use in a mobile communication device such as a portable telephone. The present invention further relates to a method of forming an electrode of such an electronic part.

A dielectric filter or duplexer is a known electronic part having a dielectric. In this connection, the dielectric duplexer has a dielectric ceramic block formed with a plurality of parallel through holes extending between the opposite end surfaces of the dielectric ceramic block. Each through hole has an inner conductor formed on an inner circumferential surface thereof and constitutes a resonator. The dielectric ceramic block has a predetermined outer peripheral surface on which an outer conductor is formed. The resonators are divided into two groups, i.e., a first group constituting a transmitting section and a second group constituting a receiving section. With the transmitting section is coupled an input terminal pad that is electrically separated from the outer conductor. With the receiving section is coupled an output terminal pad that is electrically separated from the outer conductor. Further, to a mounting surface of the dielectric ceramic block is provided an antenna terminal pad that is electrically separated from the outer conductor and capacitively coupled with the innermost conductors of the transmitting section and the receiving section. In such a duplexer, it is also known to form the output terminal pad on the side surface of the dielectric ceramic block and at a location adjacent the open-circuit end of one of the resonators constituting the receiving section so as to be opposed to the one resonator and form an extension electrode extended from the output terminal pad to the open-circuit end of the one resonator so as to be capacitively coupled with the resonators constituting the receiving section.

According to an earlier technology, the extension electrode at the open-circuit end of the one resonator is formed in the following manner. Firstly, ceramic powder is formed into a nearly rectangular parallelepiped compact having a plurality of through holes. At the time of the compact being so formed, the compact is also formed with an extension electrode-forming notch at an end surface corresponding to the open-circuit ends of the resonators of the receiving section so as to have an open end at the side surface of the dielectric ceramic block where the output terminal pad is formed. The compact is sintered to produce a dielectric ceramic block. Then, a plurality of dielectric ceramic blocks b are arranged in a row as shown in FIG. 7. Namely, the dielectric ceramic blocks b are arranged in such a manner that the surfaces on which the output terminal pads are to be formed are perpendicular to the direction in which the dielectric ceramic blocks are arranged in a row. When a plurality of dielectric ceramic blocks b are arranged in a row in the above-described manner, a recess e is formed by the extension electrode-forming notch c and the side surface of the adjacent dielectric ceramic block b. By supplying a conductive material in the form of paste into the recess e, the extension conductor d is formed. Then, the dielectric ceramic blocks b formed with the extension electrodes d are separated to obtained extension electrode-formed dielectric ceramic blocks a'. The outer conductor is formed on the outer peripheral surface of the extension electrode-formed dielectric ceramic block a' except for an open-circuit end surface and predetermined side surface portions. The input terminal pad, etc. are formed on the extension electrode-formed dielectric ceramic block a' so as to be electrically separated from the outer conductor. In the meantime, the output terminal pad is formed on the side surface of the extension electrode-formed dielectric ceramic block a' so as to be electrically connected to the extension electrode d.

SUMMARY OF THE INVENTION

However, the above-described electrode forming method has the following problem.

Namely, as shown in FIG. 7, when the conductive material is supplied into the recess e, the surface of the conductive material is U-shaped in cross section due to surface tension, i.e., shaped so as to have surface portions that rise up or extend upward along the side surfaces of the dielectric ceramic blocks b. Accordingly, the electrode d formed in the recess e has a largest thickness h' portion on the side surface k of the adjacent dielectric ceramic block b. When the dielectric ceramic blocks b are separated under this condition, the electrode d is broken and taken away together with the separated dielectric ceramic block b as shown in FIG. 8A. Further, as shown in FIG. 8B, there occurs another case in which a burr d' is caused. Such a problem is also caused in an electronic part such as a dielectric filter.

It is accordingly an object of the present invention to, provide an electronic part such as a dielectric filter or a dielectric duplexer that is free from the above noted problem.

It is a further object of the present invention to provide a method of forming an electrode of an electronic part of the above-described kind that is free from the above noted problem.

To achieve the above object, there is provided according to an aspect of the present invention an electronic part comprising a dielectric ceramic block having a pair of opposite first and second side surfaces and an end surface meeting the first and second side surfaces nearly at right angles, a first notch formed in the end surface of the dielectric ceramic block so as to have an open end at the first side surface, a second notch formed in the end surface of the dielectric ceramic block so as to have an open end at the second side surface, the first notch and second notch corresponding in shape and position when observed in the direction in which the first and second side surfaces are opposed, a first electrode formed in the first notch, and a second electrode formed in the second notch, the second electrode being a dummy electrode.

According to another aspect of the present invention, there is provided a method of forming an electrode of an electronic part, the electronic part including a dielectric ceramic block having a pair of opposite first and second side surfaces and an end surface meeting the first and second side surfaces nearly at right angles, a first notch formed in the end surface so as to have an open end at the first side surface and a first electrode formed in the first notch, the method comprising the steps of preparing a dielectric ceramic block having in addition to the first notch a second notch formed in the end surface of the dielectric ceramic block so as to have an open end at the second side surface and correspond in shape and position to the first notch when observed in the direction in which the first and second side surfaces are opposed, arranging a plurality of dielectric ceramic blocks in a row so that the first notch and the second notch of adjacent two of the dielectric ceramic blocks are joined to form a recess, supplying a conductive material into the recess and forming the first electrode and a second electrode that is a dummy electrode, and separating the dielectric ceramic blocks and thereby separating the first electrode and the second electrode of adjacent two of the dielectric ceramic blocks from each other.

BRIEF DESCRIPTION OF THE DRAWINGS

FIGS. 8A and 8B are views for illustrating steps of forming an electrode according to an earlier technology, wherein FIG. 8A shows the case where peeling off of an electrode is caused and FIG. 8B shows the case where a burr is caused.

DESCRIPTION OF THE PREFERRED EMBODIMENT

Figure 1:
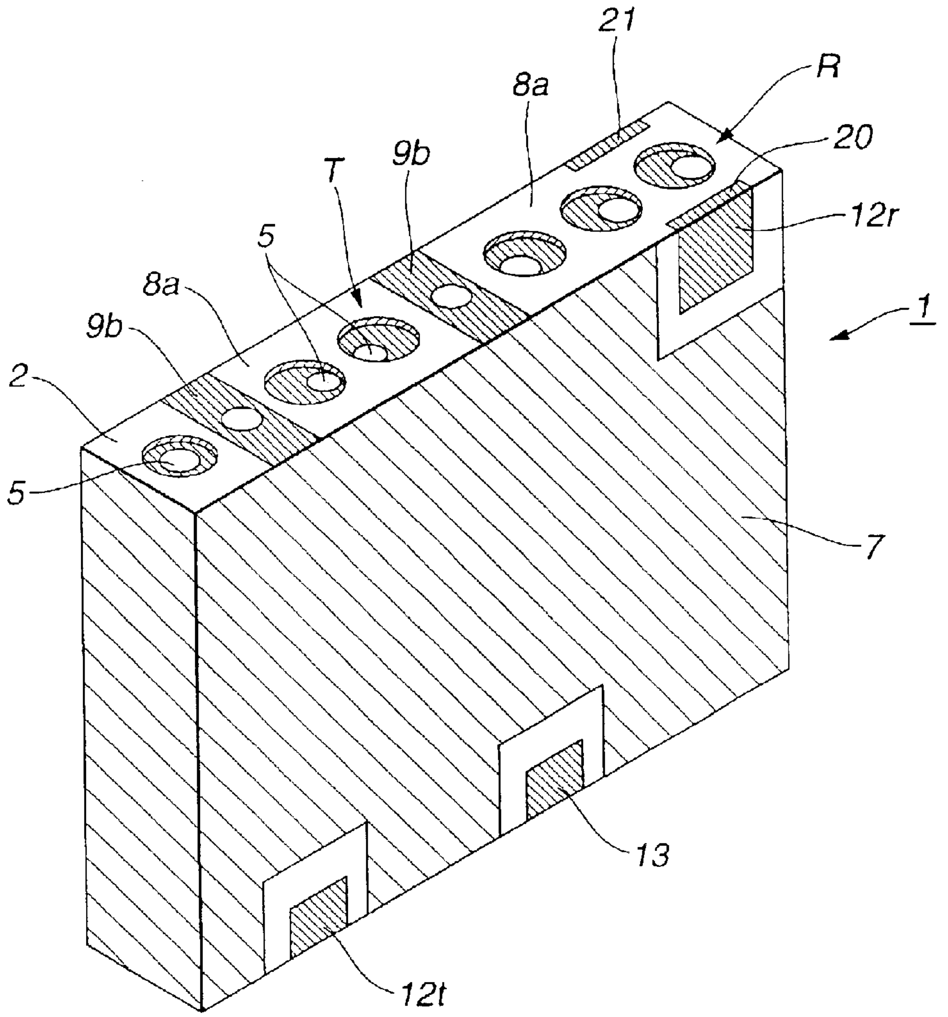
FIG. 1 is a perspective view of a dielectric duplexer according to an embodiment of the present invention.
Figure 2:
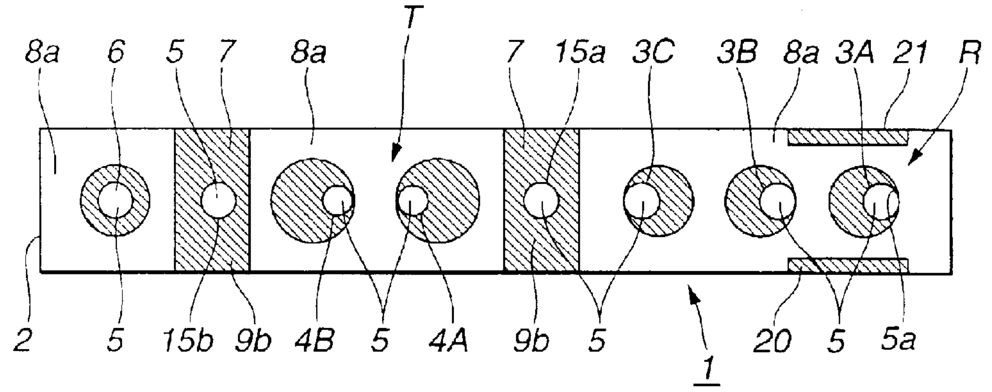
FIG. 2 is a plan view of an upper end of the dielectric duplexer of FIG. 1.
Figure 3:
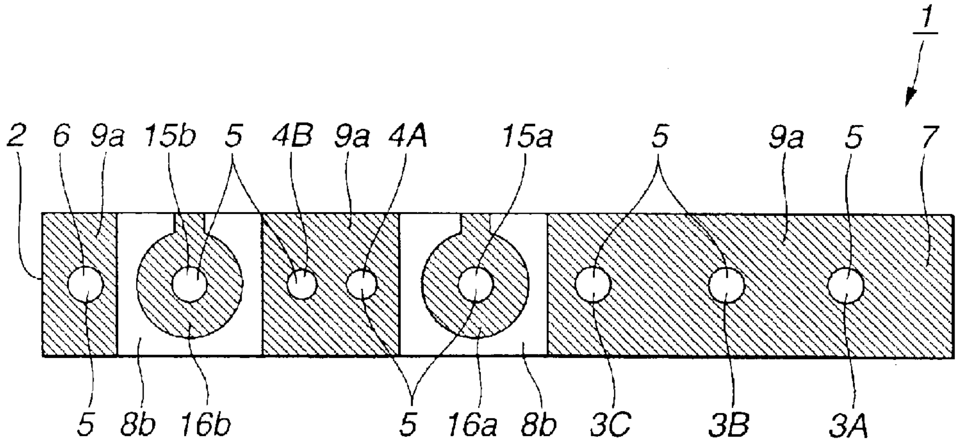
FIG. 3 is a plan view of a lower end of the dielectric duplexer of FIG. 1.

Referring to FIGS. 1 to 3, a dielectric duplexer according to an embodiment of the present invention is generally indicated by 1 and includes a rectangular parallelepiped dielectric ceramic block 2 having eight through holes 5. On an inner circumferential surface of each through hole 5 is formed an inner conductor 5*a*. Referring to FIG. 2, description of the through holes 5 being made in the order from right, three through holes 5 on the right-hand side act as resonators 3A to 3C for the receiving section, the fourth one works as an excitation hole 15*a* for an antenna, next two act as resonators 4A, 4B for the transmitting section and the seventh one works as an excitation hole 15*b* for the transmitting section, and the leftmost one acts as a resonator 6 for forming a trap. In this manner, the resonators 3A–3C, 4A, 4B, 6 are arranged in the dielectric ceramic block 2 in parallel with each other and in a row extending from one of opposite ends of the dielectric ceramic block 2 to the other. Further, the resonators are divided into a three-pole receiving section R consisting of three resonators 3A, 3B, 3C and a two-pole transmitting section T consisting of two resonators 4A, 4B. In the meantime, the resonators 3A–3C, 4A, 4B, 6 have a resonance length substantially equal to $\lambda/4$ of a desired resonance frequency.

The dielectric ceramic block 2 has at one end surface thereof open-circuit ends 8*a* of the resonators 3A–3C, 4A, 4B, 6 that are not formed with an outer conductor 7 and at the other end surface thereof short-circuit ends 9*a* (refer to FIG. 3). Further, on a predetermined outer peripheral surface of the dielectric ceramic block 2 is formed the outer conductor 7 that serves as a shield electrode.

Further, the excitation hole 15*a* for the antenna and the excitation hole 15*b* for the transmitting section have short-circuit ends 9*b* at the end surface of the dielectric ceramic block 2 on which the open-circuit ends 8*a* of the resonators 3A–3C 4A, 4B, 6 are formed. On the other hand, the excitation hole 15*a* for the antenna and the excitation hole 15*b* for the transmitting section have open-circuit ends 8*b* on the end surface of the dielectric ceramic block 2 on which the short-circuit ends 9*a* of the resonators 3A–3B, 4A, 4B, 6 are formed.

Further, as shown in FIG. 1, an antenna terminal pad 13 is formed on a side surface of the dielectric ceramic block 2 so as to be positioned adjacent the open-circuit end 8*b* of the excitation hole 15*a* for the antenna. The antenna terminal pad 13 is electrically separated from the outer conductor 7 and is, as shown in FIG. 3, electrically connected to the excitation hole 15*a* by way of a connection conductor 16*a*. The antenna terminal pad 13 is thus capacitively coupled with the innermost resonators 3C, 4A of the receiving section R and the transmitting section T by way of the excitation hole 15*a*.

Similarly, an input terminal pad 12*t* is formed on the side surface of the dielectric ceramic block 2 so as to be positioned adjacent the open-circuit end 8*b* of the excitation hole 15*b* for the transmitting section. The input terminal pad 12*t* is electrically separated from the outer conductor 7 and electrically connected to the excitation hole 15*b* by way of a connection conductor 16*b*. The input terminal pad 12*t* is thus capacitively coupled with the transmitting section T by way of the excitation hole 15*b*.

An outlet terminal pad 12*r* of the receiving section R is formed on the side surface of the dielectric ceramic block 2 so as to be positioned adjacent the open-circuit end 8*a* and opposed to the outermost resonator 3A and is electrically separated from the outer conductor 7. The outlet terminal pad 12*r* is thus capacitively coupled with the receiving section R.

Figure 4:
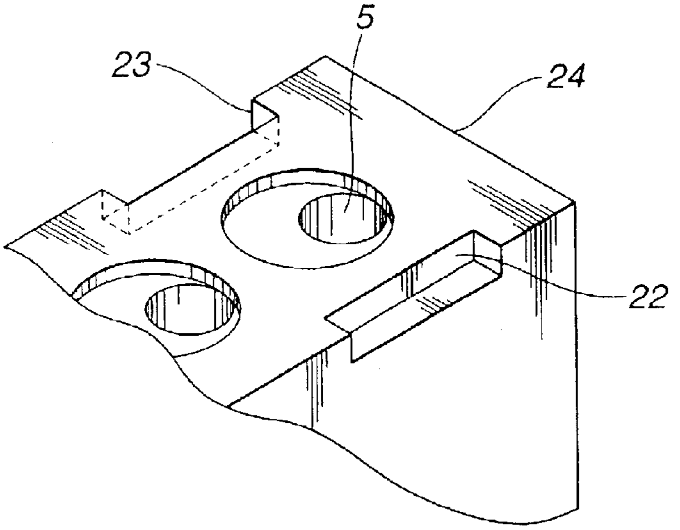
FIG. 4 is a perspective view of a portion of a compact for the dielectric duplexer of FIG. 1.

A nearly rectangular parallelepiped extension electrode 20 is formed at an end surface of the dielectric ceramic block 2 at which the open-circuit end 8*a* is provided, so as to extend from the outlet terminal pad 12*r* and be positioned adjacent the side surface of the dielectric ceramic block 2 on which the output terminal pad 12*r* is formed. The extension electrode 20 is formed by supplying a conductive material m into a notch 22 (refer to FIG. 4) that will be described later. In the meantime, by grinding off the extension electrode 20, adjustment of the attenuation characteristics of the dielectric duplexer 1 can be attained.

On the other hand, a dummy electrode 21 is formed at the end surface of the dielectric ceramic block 2 at which the open-circuit end 8*a* is provided so as to be opposed to the extension electrode 20 in the thickness direction of the dielectric ceramic block 2 (i.e., in the direction in which the side surfaces of the dielectric ceramic block 2 are opposed). The dummy electrode 21 is nearly equal in shape to the extension electrode 20 and is electrically connected to the outer conductor 7. Namely, the dummy electrode 21 is formed at the end surface of the dielectric ceramic block 2 so as to be positioned adjacent a second side surface of the dielectric ceramic block 2 opposite to a first side surface where the terminal pad 12*r* is formed and correspond in shape and position to the extension electrode 20 when observed in the direction in which the first and second side surfaces are opposed. In this connection, the end surface of the dielectric ceramic block 2 at which the extension electrode 20 and the dummy electrode 21 are formed meets the first and second side surfaces nearly at right angles. Further, similarly to the extension electrode 20, the dummy electrode 21 is formed by supplying a conductive material m into a dummy electrode-forming notch 23 that will be described later. In the meantime, the dummy electrode 21 is not formed for adjustment of the attenuation characteristics.

Then, the method of producing the dielectric duplexer 1 will be described.

Firstly, ceramic powder such as rare earth oxide ceramic powder is supplied into a die and compacted under the pressure of about 1000 Kg/cm$^2$ and thereby formed into a nearly rectangular parallelepiped compact. In this instance, through holes 5 are formed simultaneously with formation of the compact by disposing cores in the form of a bar inside the die.

Then, the compact is pressed in another die having at the inner surface thereof projections corresponding to the extension electrode-forming notch 22 and the dummy electrode-forming notch 23. The compact is thus formed with the extension electrode-forming notch 22 that has an open end at the side surface corresponding to the dielectric ceramic block side surface where the outlet terminal pad 12*r* is formed and the dummy electrode notch 23 that has an open end at the side surface corresponding to the dielectric ceramic block side surface where the outlet terminal pad 12*r* is not formed. In this embodiment, the extension electrode-forming notch 22 and the dummy electrode-forming notch 23 have a nearly equal rectangular parallelepiped shape. Namely, the open ends of the extension electrode-forming notch 22 and the dummy electrode-forming notch 23 at the respective side surfaces have a nearly equal rectangular shape.

The compact 24 is sintered at the temperature ranging from about 1200° C. to 1700° C. and formed into the dielectric ceramic block 2.

Figure 5:
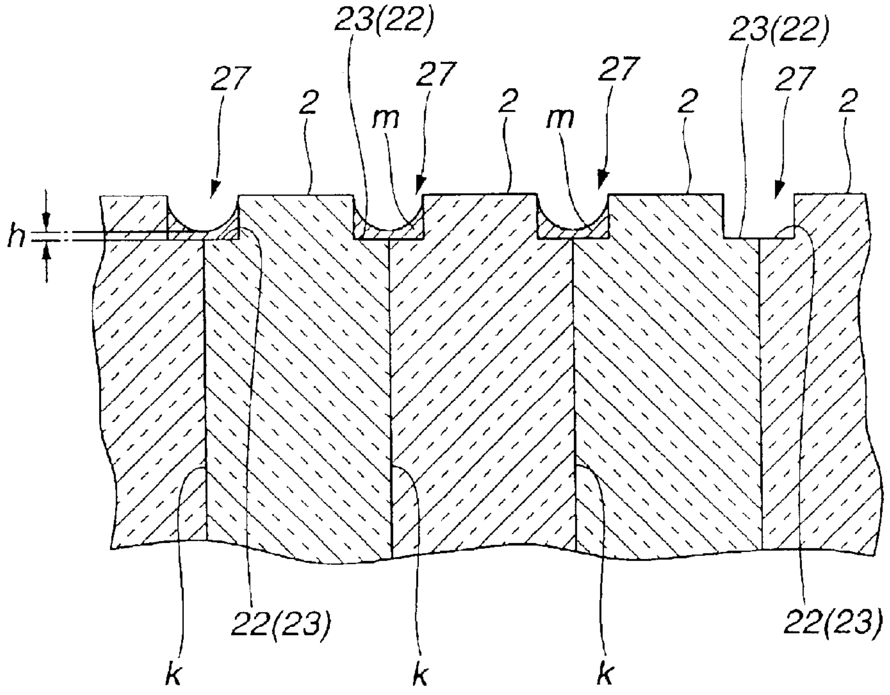
FIG. 5 is a fragmentary sectional view of a plurality of dielectric ceramic blocks in a state of being arranged in a row and illustrates a step of forming an electrode of the dielectric duplexer of FIG. 1.

Then, as shown in FIG. 5, a plurality of dielectric ceramic blocks 2 are arranged in a row in a way as to allow the extension electrode-forming notch 22 and the dummy electrode-forming notch 23 of adjacent two of the dielectric ceramic blocks 2 to be disposed opposite to each other or to be joined to form a recess 27. Then, a conductive material m is supplied into the recesses 27 sequentially or all at once, the extension electrode 20 is formed together with the dummy electrode 21. Thereafter, by separating the dielectric ceramic blocks 2 from each other, extension electrode-formed dielectric ceramic blocks 2*a* each having the extension electrode 20 and the dummy electrode 21 are obtained.

Figure 6:
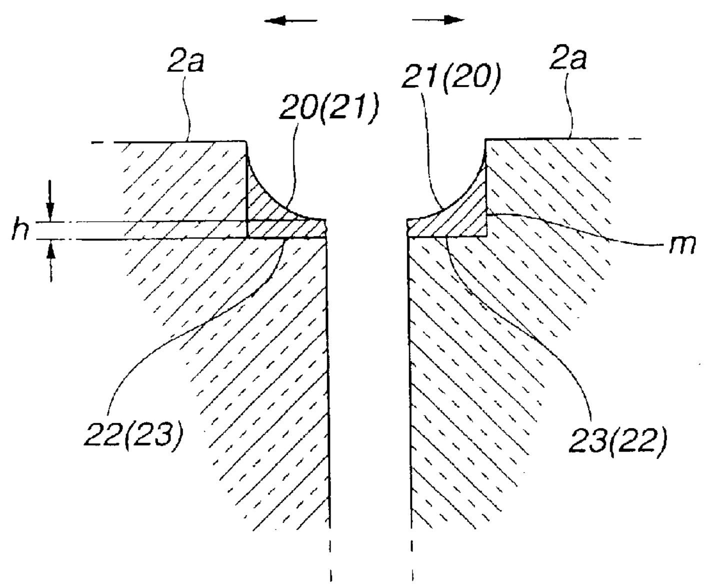
FIG. 6 is a fragmentary sectional view of adjacent two dielectric ceramic blocks in a state of being separated after an electrode is formed and illustrates a step of forming an electrode of the dielectric duplexer of FIG. 1.
Figure 7:
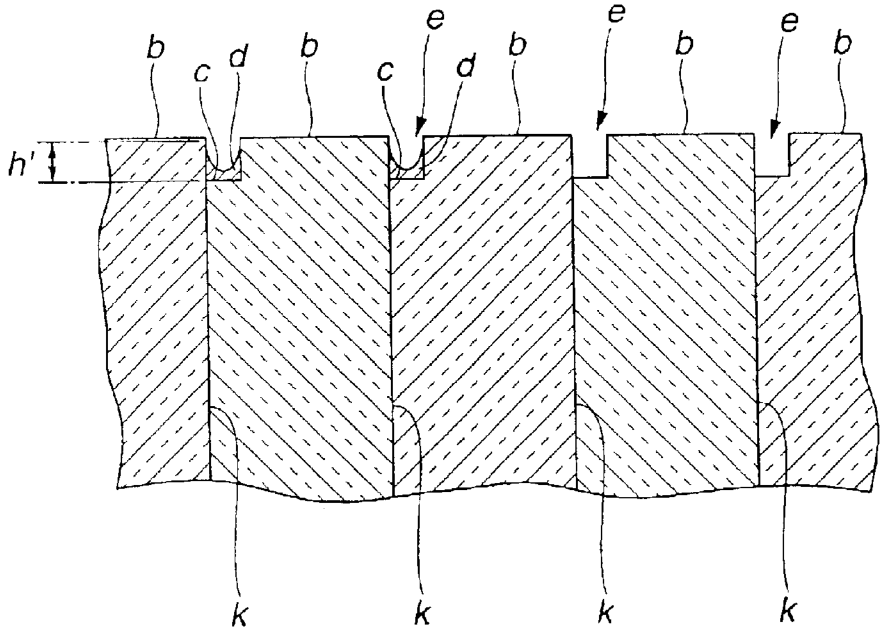
FIG. 7 is a view similar to FIG. 5 but shows a step of forming an electrode according to an earlier technology.
Figure 8A:
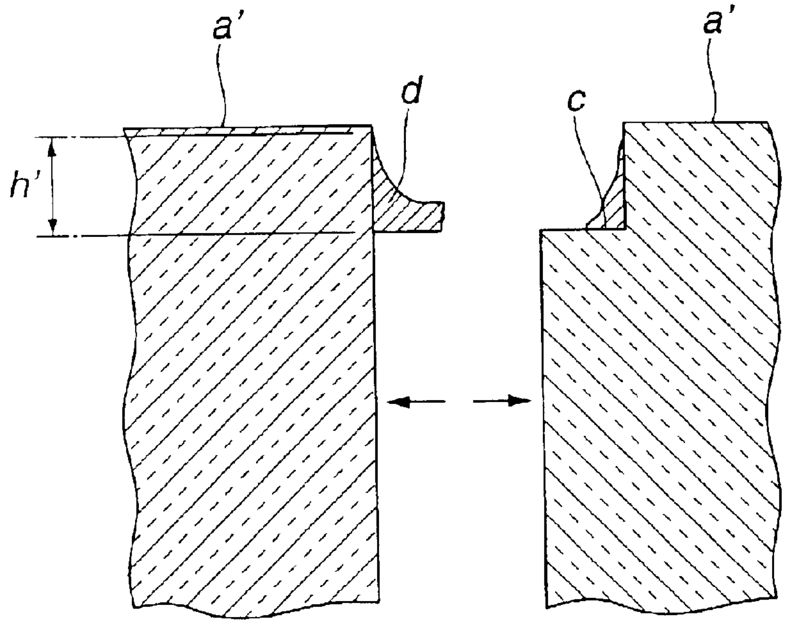
Figure 8B:
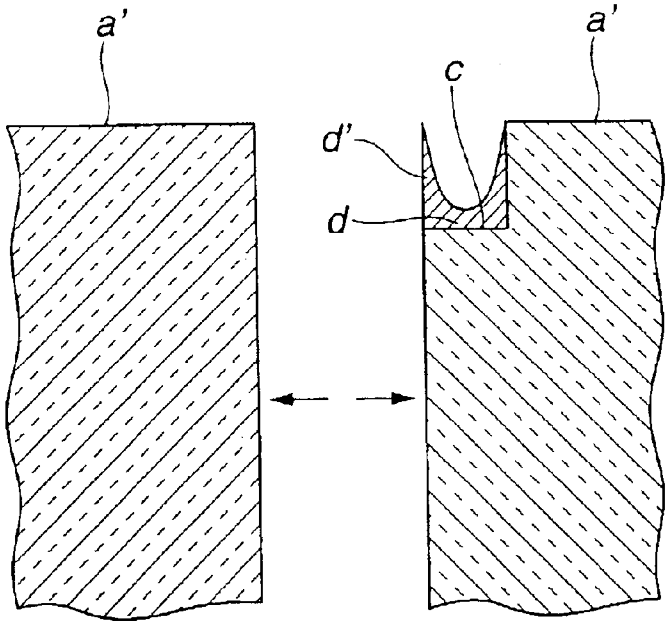

When the dummy electrode-forming notch 23 is formed by the above-described method, the conductive material m supplied into the recess 27 has a smallest thickness h along the joining surface k at which adjacent two dielectric ceramic blocks 2 meet. Accordingly, as shown in FIG. 6, when the dielectric ceramic blocks 2 are separated to obtain the extension electrode-formed dielectric ceramic blocks 2*a*, the conductive material m is divided at the place where the thickness is smallest, thus not causing the above-noted peeling off or burrs of the conductive material m.

In this connection, it is a general practice to carry out a step of forming inner conductors within the through holes 5 simultaneously with the above-described electrode-forming step.

Thereafter, a conductive material m in a state of paste is applied to a predetermined outer peripheral surface of the extension electrode-formed dielectric ceramic block 2*a* by screen-printing to form the outer conductor 7. Then, by forming the input terminal pad 12*t*, output terminal pad 12*r* and antenna terminal pad 13 on the extension electrode-formed dielectric ceramic block 2*a* so as to be electrically separated from the outer conductor 7, the dielectric duplexer 1 is obtained. In this connection, the output terminal pad 12*r* is formed so as to be electrically connected to the extension electrode 20.

In the meantime, if in such an electrode forming method a plurality of dielectric ceramic blocks 2 are arranged in a row, the outside notch of the outermost dielectric ceramic block 2 cannot form the recess 27 since there is not any mating notch. In such a notch that cannot form the recess 27, an electrode is formed by squeezing of a conductive material m.

From the foregoing, it will be understood that according to the present invention a dielectric duplexer has a dummy electrode that is formed together with an extension electrode of another dielectric duplexer by supplying a conductive material into a common recess. This structure makes it possible to prevent peeling off or burrs of the extension electrode when the extension electrode is separated from the dummy electrode. Namely, a plurality of dielectric ceramic blocks are arranged in a row in a way as to allow an extension electrode-forming notch and a dummy electrode-forming notch of adjacent two dielectric ceramic blocks to join together to constitute a recess. A conductive material is supplied into the recess to form an extension electrode and dummy electrode. Thereafter, the dielectric ceramic blocks are separated from each other to form extension electrodes for electronic parts such as a dielectric duplexer or filter. This makes it possible for the conductive material supplied into the recess to become thinnest along a joining line or surface at which adjacent two dielectric ceramic blocks are joined or meet. This makes it possible to prevent the electrode of one of adjacent two dielectric ceramic blocks to be partially taken off by the other of the dielectric ceramic blocks, thus making it possible to prevent undesired peeling off or burrs of the extension electrode.

The entire contents of Japanese Patent Application No. 2002-097301 (filed Mar. 29, 2002) are incorporated herein by reference.

Although the invention has been described above by reference to a certain embodiment of the invention, the invention is not limited to the embodiment described above. Modifications and variations of the embodiment described above will occur to those skilled in the art, in light of the above teachings. For example, the extension electrode 20 can extend from another terminal pad. Further, the shape of the extension electrode 20 can be changed variously. Further, the extension electrode-forming notch 22 and the dummy electrode-forming notch 23 need not be completely the same in shape. Further, the number of the resonators 3A–3C, 4A, 4B, 6 can be changed according to the necessity. Further, the present invention can be applied to another electronic part such as a dielectric filter. In this connection, the dielectric filter can have substantially the same structure as the dielectric duplexer having been described and shown with reference to FIGS. 1 to 3. The scope of the invention is defined with reference to the following claims.

What is claimed is:

1. An electronic part comprising:

a dielectric ceramic block having a pair of opposite first and second side surfaces and an end surface nearly perpendicular to the first and second side surfaces;

a first notch formed in the end surface of the dielectric ceramic block at a location adjacent the first side surface so as to have an open end at the first side surface;

a second notch formed in the end surface of the dielectric ceramic block adjacent the second side surface so as to have an open end at the second side surface;

the first notch and the second notch corresponding in shape and position when observed in the direction in which the first and second side surfaces are opposed;

a first electrode formed in the first notch; and a second electrode formed in the second notch;

the second electrode being a dummy electrode.

2. An electronic part according to claim 1, wherein the first notch and the second notch have a nearly equal rectangular parallelepiped shape.

3. An electronic part according to claim 1, wherein the open ends of the first notch and the second notch have a nearly equal rectangular shape.

4. An electronic part according to claim 1, further comprising a plurality of resonators having inner conductors, carried by the dielectric ceramic block and arranged parallely in a row, an outer conductor formed on a predetermined outer peripheral surface of the dielectric ceramic block and a terminal pad formed on the first side surface so as to be electrically separated from the outer conductor, the first electrode, comprising an extension electrode electrically connected to the output terminal pad.

5. An electronic part comprising:

a dielectric ceramic block;

a plurality of resonators carried by the dielectric ceramic block and arranged parallely in a row;

each of the resonators having a through hole and an inner conductor formed on the inner circumferential surface of the through hole;

an outer conductor formed on a predetermined outer peripheral surface of the dielectric ceramic block;

the dielectric ceramic block having an end surface at which each of the resonators has an open end and a pair of first and second side surfaces meeting the end surface nearly at right angles;

a terminal pad formed on the first side surface of the dielectric ceramic block so as to be capacitively coupled with one of the resonators and electrically separated from the outer conductor;

a first notch formed in the end surface of the dielectric ceramic block so as to have an open end at the first side surface;

a second notch formed in the end surface of the dielectric ceramic block so as to have an open end at the second side surface;

the first notch and second notch corresponding in shape and position when observed in the direction in which the first and second side surfaces are opposed;

an extension electrode formed in the first notch so as to be electrically connected to the output terminal pad; and a dummy electrode formed in the second notch.

6. An electronic part according to claim 5, wherein the first notch and the second notch have a nearly equal rectangular parallelepiped shape.

7. An electronic part according to claim 5, wherein the open ends of the first notch and the second notch have a nearly equal rectangular shape.

8. A dielectric duplexer comprising an electronic part according to claim 5.

9. A dielectric filter comprising an electronic part according to claim 5.

10. A method of forming an electrode of an electronic part, the electronic part including a dielectric ceramic block having a pair of opposite first and second side surfaces and an end surface meeting the first and second side surfaces nearly at right angles, a first notch formed in the end surface so as to have an open end at the first side surface and a first electrode formed in the first notch, the method comprising the steps of:

preparing a dielectric ceramic block having in addition to the first notch a second notch formed in the end surface of the dielectric ceramic block so as to have an open end at the second side surface and correspond in shape and position to the first notch when observed in the direction in which the first and second side surfaces are opposed;

arranging a plurality of dielectric ceramic blocks in a row so that the first notch and the second notch of adjacent two of the dielectric ceramic blocks are joined to form a recess;

supplying a conductive material into the recess and forming the first electrode integral with the second electrode that is a dummy electrode; and separating the dielectric ceramic blocks and thereby separating the first electrode and the second electrode of adjacent two of the dielectric ceramic blocks from each other.

11. A method according to claim 10, wherein the electronic part further comprising a plurality of resonators having inner conductors, carried by the dielectric ceramic block and arranged parallely in a row, an outer conductor formed on a predetermined outer peripheral surface of the dielectric ceramic block and a terminal pad formed on the first side surface so as to be electrically separated from the outer conductor, the first electrode being an extension electrode electrically connected to the output terminal pad, the method further comprising grinding off a portion of the extension electrode for adjustment of operational characteristics of the electronic part.

12. A method of forming an electrode of an electronic part, the electronic part including a dielectric ceramic block, a plurality of resonators carried by the dielectric ceramic block and arranged parallely in a row, each of the resonators having a through hole and an inner conductor formed on the inner circumferential surface of the through hole, an outer conductor formed on a predetermined outer peripheral surface of the dielectric ceramic block, the dielectric ceramic block having an end surface at which each of the resonators has an open end and a pair of first and second side surfaces meeting the end surface nearly at right angles, a terminal pad formed on the first side surface of the dielectric ceramic block so as to be capacitively coupled with one of the resonators and electrically separated from the outer conductor, an extension electrode-forming notch formed in the end surface of the dielectric ceramic block so as to have an open end at the first side surface, and an extension electrode formed in the extension electrode-forming notch so as to be electrically connected to the terminal pad, the method comprising the steps of:

preparing a dielectric ceramic block having in addition to the extension electrode-forming notch a dummy electrode-forming notch that is formed in the end surface of the dielectric ceramic block so as to have an open end at the second side surface and correspond in shape and position to the extension electrode-forming notch when observed in the direction in which the first and second side surfaces are opposed;

arranging a plurality of dielectric ceramic blocks in a row so that the extension electrode-forming notch and the dummy electrode-forming notch of adjacent two of the dielectric ceramic blocks are joined to form a recess;

supplying a conductive material into the recess and thereby forming the extension electrode integral with the dummy electrode; and separating the dielectric ceramic blocks and thereby separating the extension electrode and the dummy electrode of adjacent two of the dielectric ceramic blocks from each other.

13. A method according to claim 12, further comprising grinding off a portion of the extension electrode for adjustment of operational characteristics of the electronic part.

* * * * *